United States Patent
Chou

(10) Patent No.: US 7,741,889 B2
(45) Date of Patent: Jun. 22, 2010

(54) PHASE LOCKED LOOP WITH PHASE ROTATION FOR SPREADING SPECTRUM

(75) Inventor: Min-Chung Chou, Toufen Township, Miaoli County (TW)

(73) Assignee: Sunplus Technology Co., Ltd, Hsinchu (TW)

( * ) Notice: Subject to any disclaimer, the term of this patent is extended or adjusted under 35 U.S.C. 154(b) by 0 days.

(21) Appl. No.: 12/010,463

(22) Filed: Jan. 25, 2008

(65) Prior Publication Data

US 2008/0180142 A1 Jul. 31, 2008

(30) Foreign Application Priority Data

Jan. 26, 2007 (TW) .............................. 96102971 A

(51) Int. Cl.
*H03L 7/06* (2006.01)
(52) U.S. Cl. ...................................... 327/157; 327/156
(58) Field of Classification Search .................. 327/157, 327/156
See application file for complete search history.

(56) References Cited

U.S. PATENT DOCUMENTS

| | | | |
|---|---|---|---|
| 4,072,910 A * | 2/1978 | Dingwall et al. ............... 331/57 |
| 6,989,718 B2 * | 1/2006 | Pretl et al. ..................... 331/16 |
| 7,321,267 B2 * | 1/2008 | Salonen et al. ................. 331/11 |
| 2006/0014513 A1 * | 1/2006 | Uozumi et al. ............... 455/323 |
| 2006/0045205 A1 * | 3/2006 | Jensen ......................... 375/297 |
| 2006/0046663 A1 * | 3/2006 | Yu ................................. 455/76 |
| 2006/0050830 A1 * | 3/2006 | Da Dalt et al. ............... 375/376 |
| 2006/0078079 A1 * | 4/2006 | Lu .............................. 375/376 |

\* cited by examiner

*Primary Examiner*—Lincoln Donovan
*Assistant Examiner*—Adam D Houston
(74) *Attorney, Agent, or Firm*—Bacon & Thomas, PLLC

(57) ABSTRACT

A phase locked loop (PLL) with phase rotation spreading includes a phase detector, a charge pump, a filter, a voltage controlled oscillator (VCO) and a selector. The phase detector receives a reference clock signal and a feedback clock signal to thereby produce an error signal. The charge pump converts the error signal into a current signal. The filter converts the current signal into a voltage signal. The VCO produces N clock signals with a same frequency in accordance with the voltage signal, where the N clock signals have phases $\theta_0$ to $\theta_{N-1}$ respectively, and $\theta_j$ indicates a lead of $2\pi/N$ over $\theta_{j+1}$, for $j=0, 1, \ldots, N-2$. The selector selects one from the N clock signals in accordance with a predetermined sequence to thereby produce a target clock signal, and finely adjusts a frequency of the target clock signal for a spreading operation.

16 Claims, 7 Drawing Sheets

PHASE LOCKED LOOP WITH PHASE ROTATION FOR SPREADING SPECTRUM

BACKGROUND OF THE INVENTION

1. Field of the Invention

The present invention relates to a phase locked loop (PLL) and, more particularly, to a PLL with phase rotation for spreading spectrum.

2. Description of Related Art

With rapidly improved electronic technologies, various applications can be provided by the electronic products. However, due to the increasingly complex electronic applications, the clocks required for the applications are different, and accordingly a PLL becomes an optimal choice to meet the requirements of saving the cost and providing the different clocks. FIG. 1 is a block diagram of a typical PLL 100. As shown in FIG. 1, the PLL 100 includes a phase detector 110, a charge pump 120, a low pass filter (LPF) 130, a voltage controlled oscillator (VCO) 140 and a frequency divider 150. The PLL 100 receives an input signal with a frequency Fin and produces an output signal with a frequency Fout, for Fout=Y×Fin and Y is an integer or a fraction. In this case, the electromagnetic interference (EMI) detection cannot be passed frequently because the frequency Fout of the output signal is relatively greater than the frequency Fin of the input signal. Also, the other electronic components can be easily interfered.

To overcome the aforementioned problem, U.S. Pat. No. 6,377,646 granted to Sha for a "Spread Spectrum at Phase Lock Loop Feedback Path" discloses a method for spreading spectrum of a PLL output signal, which uses a read only memory (ROM) to record a correction value for changing the divisor currently used in the feedback divider and applies a phase swallowing to the feedback divider for spreading spectrum of the PLL output signal. However, such a spreading way essentially changes the divisor in the feedback divider to thereby change the output frequency, and cannot be applied to a PLL in which the output frequency necessarily equals to the input frequency. In addition, such a spreading way cannot be applied when a feedback divider has a relatively small divisor, which causes the phase detector to output a significant error signal and further affects the spreading effect.

Therefore, it is desirable to provide an improved PLL to mitigate and/or obviate the aforementioned problems.

SUMMARY OF THE INVENTION

The object of the present invention is to provide a PLL with phase rotation for spreading spectrum, which can reduce the EMI and does not interfere the other electronic components.

In accordance with one aspect of the present invention, there is provided a phase locked loop (PLL) with phase rotation for spreading spectrum. The PLL includes a phase detector, a charge pump, a filter, a voltage controlled oscillator (VCO) and a selector. The phase detector receives a reference clock signal and a feedback clock signal to thereby produce an error signal. The charge pump is connected to the phase detector in order to convert the error signal into a current signal. The filter is connected to the charge pump in order to convert the current signal into a voltage signal. The voltage controlled oscillator (VCO) is connected to the filter in order to produce N clock signals with a same frequency based on the voltage signal, wherein the N clock signals have phases $\theta_0$ to $\theta_{N-1}$ respectively, and $\theta_j$ indicates a lead of $2\pi/N$ over $\theta_{j+1}$ for $j=0, 1, \ldots, N-2$. The selector is connected to the VCO in order to select one from the N clock signals based on a predetermined sequence to thereby produce a target clock signal.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
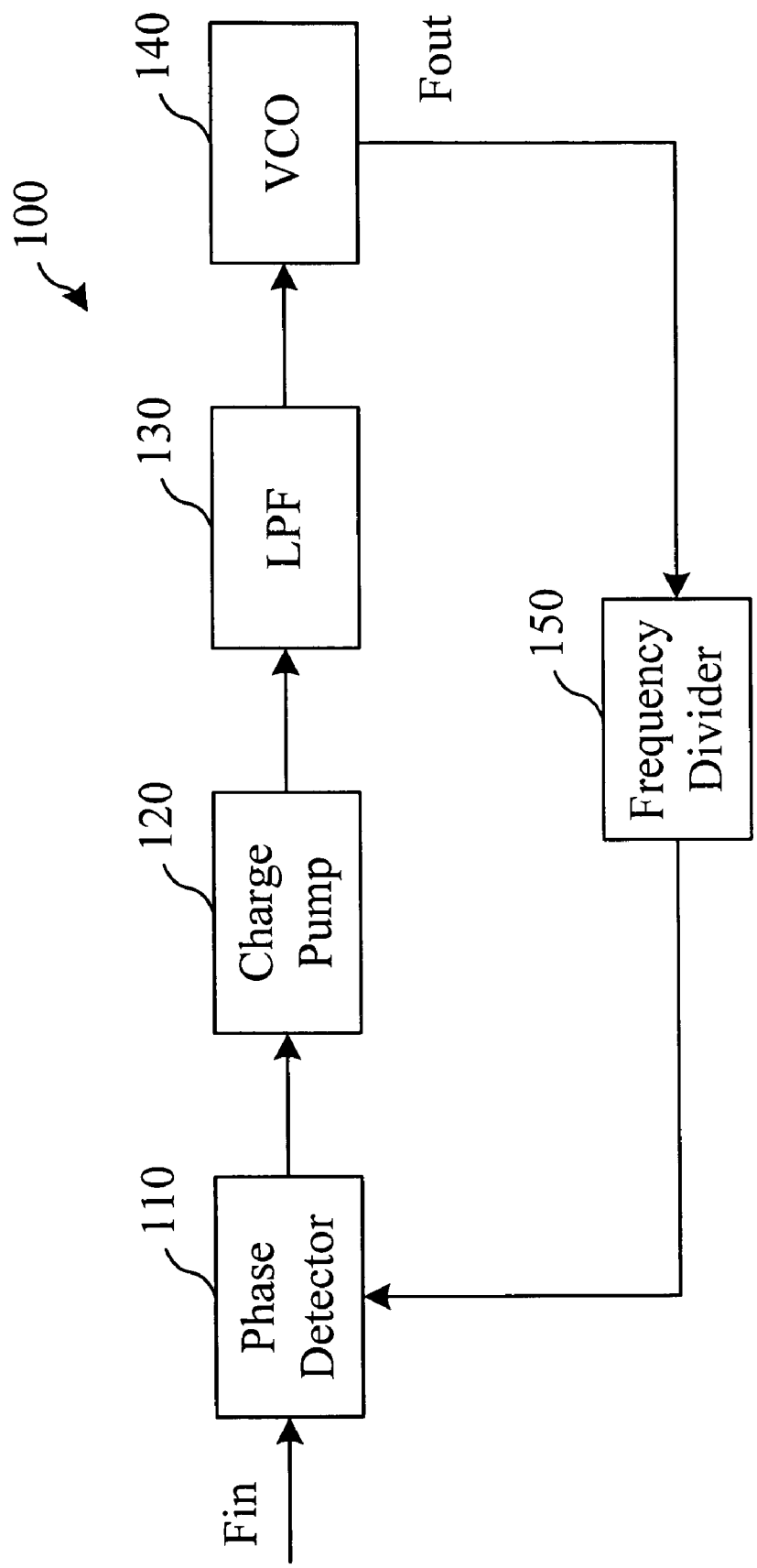
FIG. 1 is a block diagram of a conventional PLL.
Figure 2:
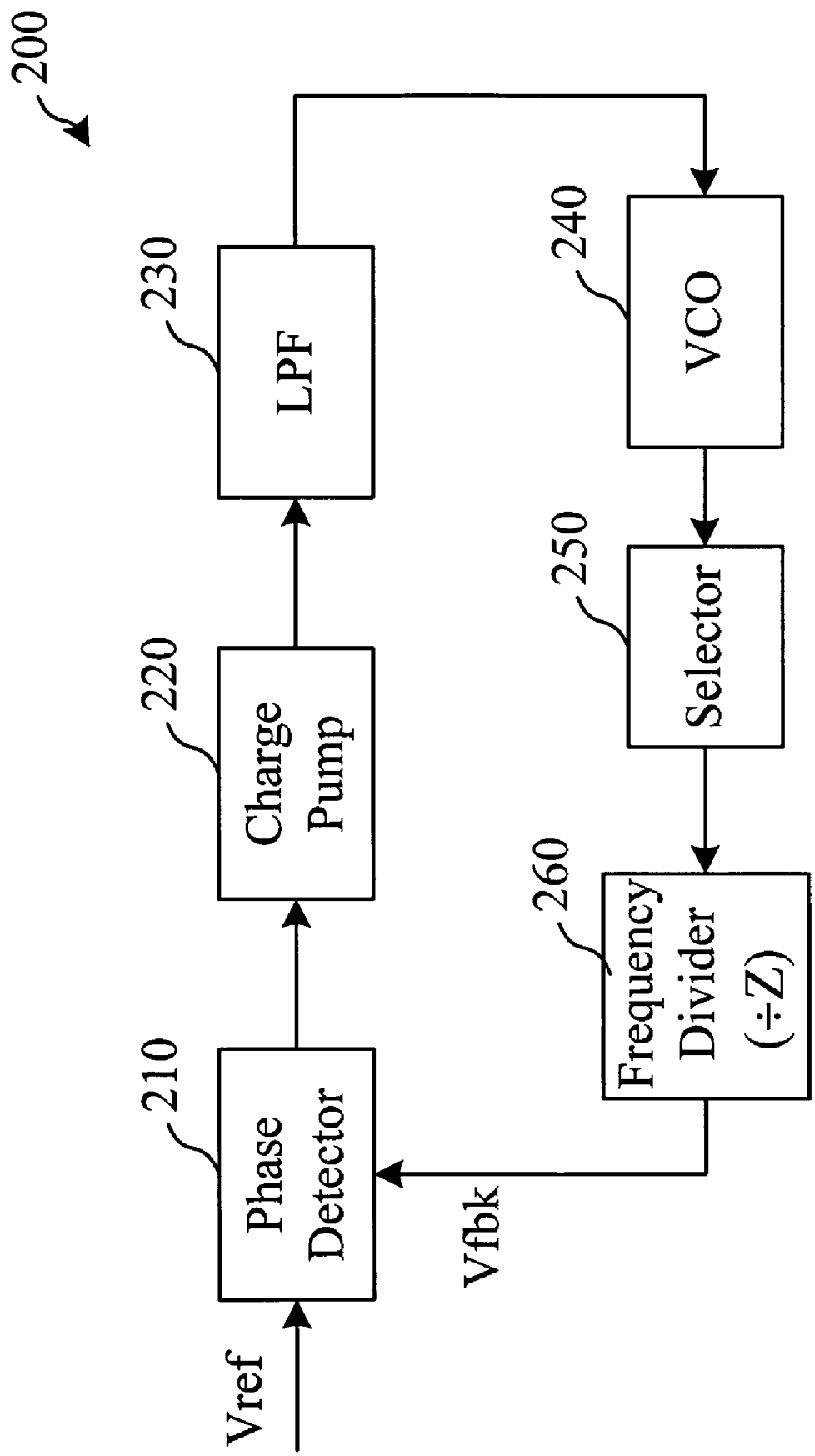
FIG. 2 is a block diagram of a PLL with phase rotation for spreading spectrum in accordance with the invention.

FIG. 2 is a block diagram of a phase locked loop (PLL) 200 with phase rotation for spreading spectrum in accordance with the invention. In FIG. 2, the PLL 200 includes a phase detector 210, a charge pump (CP) 220, a filter 230, a voltage controlled oscillator (VCO) 240, a selector 250 and a frequency divider 260.

The phase detector 210 receives a reference clock signal Vref and a feedback clock signal Vfbk to thereby produce an error signal, which is a phase error signal.

The charge pump 220 is connected to the phase detector 210 in order to convert the error signal into a current signal.

The filter 230, which is a low pass filter (LPF), is connected to the charge pump 220 in order to convert the current signal into a voltage signal.

Figure 3:
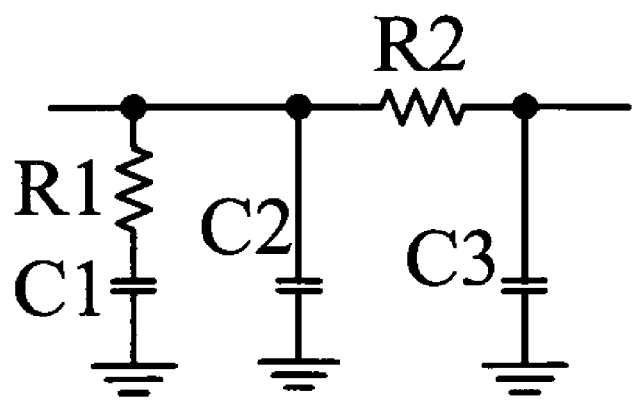
FIG. 3 is a circuit diagram of a passive LPF in accordance with the invention.

The LPF can be a passive filter. FIG. 3 is a circuit diagram of the passive LPF, which for example is a three-stage LPF. The three-stage LPF includes a first resistor R1, a first capacitor C1, a capacitor C2, a second resistor R2 and a third capacitor C3.

As shown in FIG. 3, the first resistor R1 has a first terminal connected to the charge pump 220 and a second terminal connected to a first terminal of the first capacitor C1. The first capacitor C1 has a second terminal connected to a low potential. The second capacitor C2 has a first terminal connected to the charge pump 220 and a second terminal connected to the low potential. The second resistor R2 has a first terminal connected to the charge pump 220 and a second terminal connected to a first terminal of the third capacitor C3 and the VCO 240. The third capacitor C3 has a second terminal connected to the low potential.

The first resistor R1 and the first capacitor C1 provide a first pole and a zero. The second capacitor C2 provides a second pole. The second resistor R2 and the third capacitor C3 provide a third pole.

Figure 4:
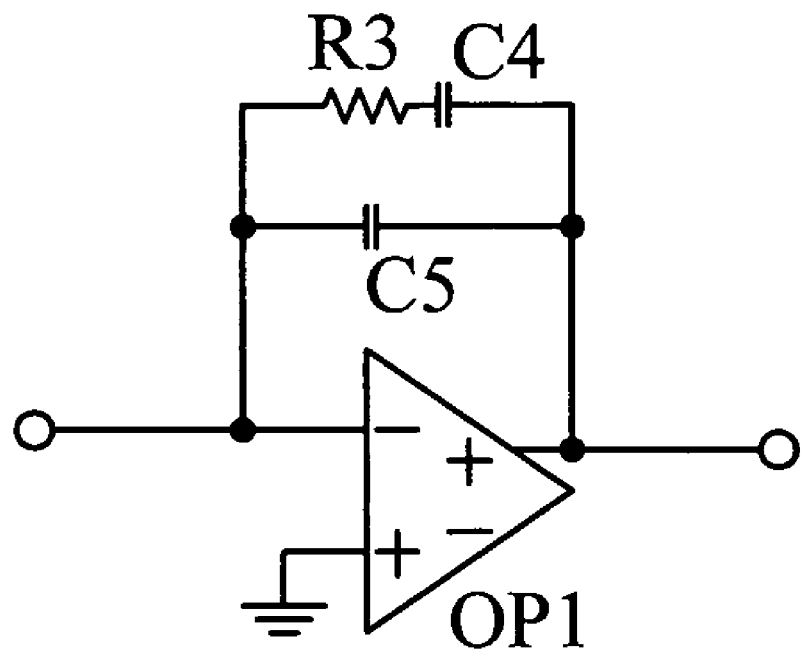
FIG. 4 is a circuit diagram of an active LPF in accordance with the invention.

In addition, the LPF 230 can be an active filter. FIG. 4 is a circuit diagram of the active LPF, which for example is a two-stage LPF. The two-stage LPF includes a third resistor R3, a fourth capacitor C4, a fifth capacitor C5 and an operational amplifier OP1.

As shown in FIG. 4, the operational amplifier OP1 has a positive input terminal (+) connected to a low potential, a positive output terminal connected to a second terminal of the fourth capacitor C4 and a second terminal of the fifth capacitor C5, and a negative input terminal (−) connected to the charge pump 220, a first terminal of the third resistor R3 and a first terminal of the fifth capacitor C5. The third resistor R3 has a second terminal connected to a first terminal of the fourth capacitor C4.

The operational amplifier OP1 of the active LPF shown in FIG. 4 can increase the output voltage swing and provide convenient adjustment of the positions of the poles and the zero to thereby obtain a better frequency response.

Figure 5:
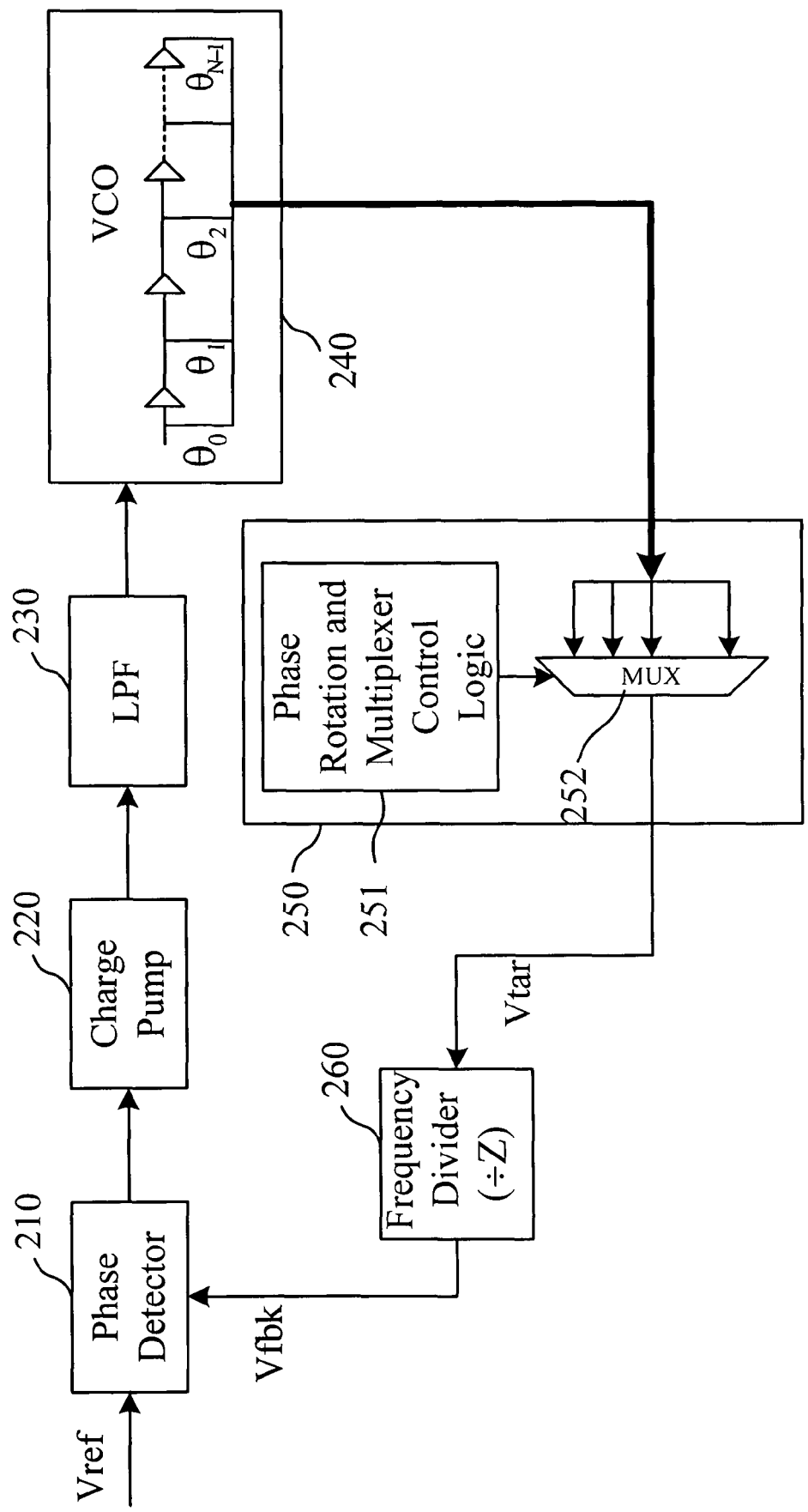
FIG. 5 is a schematic diagram of a VCO and a selector in accordance with the invention.

FIG. 5 is a schematic diagram of the VCO 240 and the selector 250. The VCO 240 is connected to the filter 230 in order to produce N clock signals with a same frequency in accordance with the voltage signal. The VCO 240 is preferably a ring oscillator to thereby provide the N clock signals with phases $\theta_0$, $\theta_1$, $\theta_2$, ..., and $\theta_{N-1}$ respectively, where $\theta_j$ indicates a lead of $2\pi/N$ over $\theta_{j+1}$ for j=0, 1, 2, ..., N−2.

The selector 250 is connected to the VCO 240 in order to select one from the N clock signals in accordance with a predetermined sequence to thereby produce a target clock signal Vtar. The selector 250 includes a phase rotation and multiplexer control logic 251 and an N-to-1 multiplexer 252.

The frequency divider 260 is connected to the selector 250 in order to frequency divide the target clock signal Vtar and produce the feedback clock signal Vfbk. The frequency divider 260 performs an integral frequency dividing on the target clock signal Vtar to thereby produce the feedback clock signal Vfbk. In other embodiments, the frequency divider 260 can perform a fractional frequency dividing on the target clock signal Vtar to thereby produce the feedback clock signal Vfbk.

Figure 6:
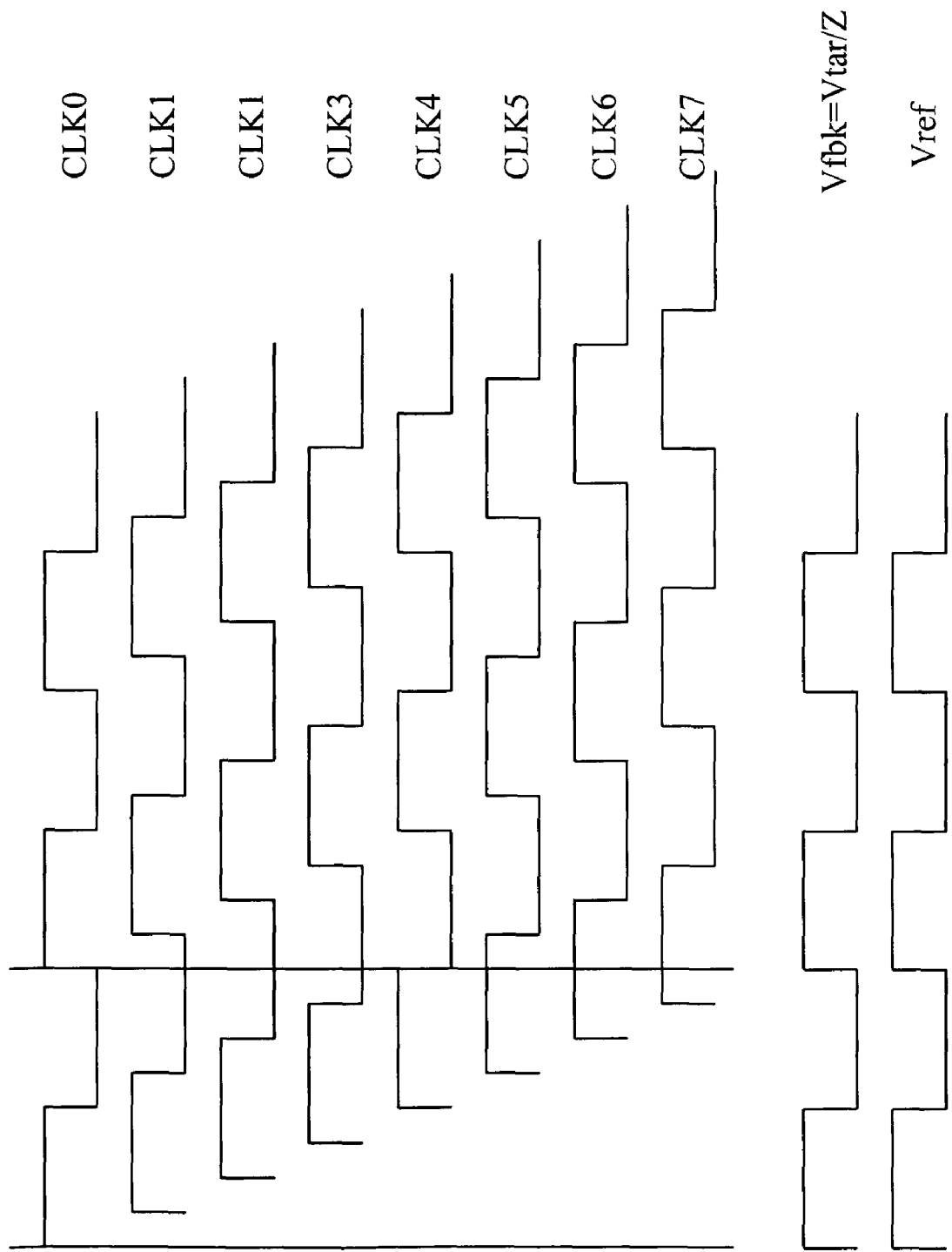
FIG. 6 is a schematic chart of no spreading operation.

FIG. 6 is a schematic chart of no frequency spreading operation. The multiplexer 252 selects a clock signal CLK0 with a phase $\theta_0$ as the target clock signal Vtar. The target clock signal Vtar is frequency divided by the frequency divider 260 (in this case, the divisor is one) to thereby produce the feedback clock signal Vfbk. As shown in FIG. 6, since no frequency spreading operation is performed, the feedback and the reference clock signals Vfbk and Vref have no phase difference when the phase is locked.

Figure 7:
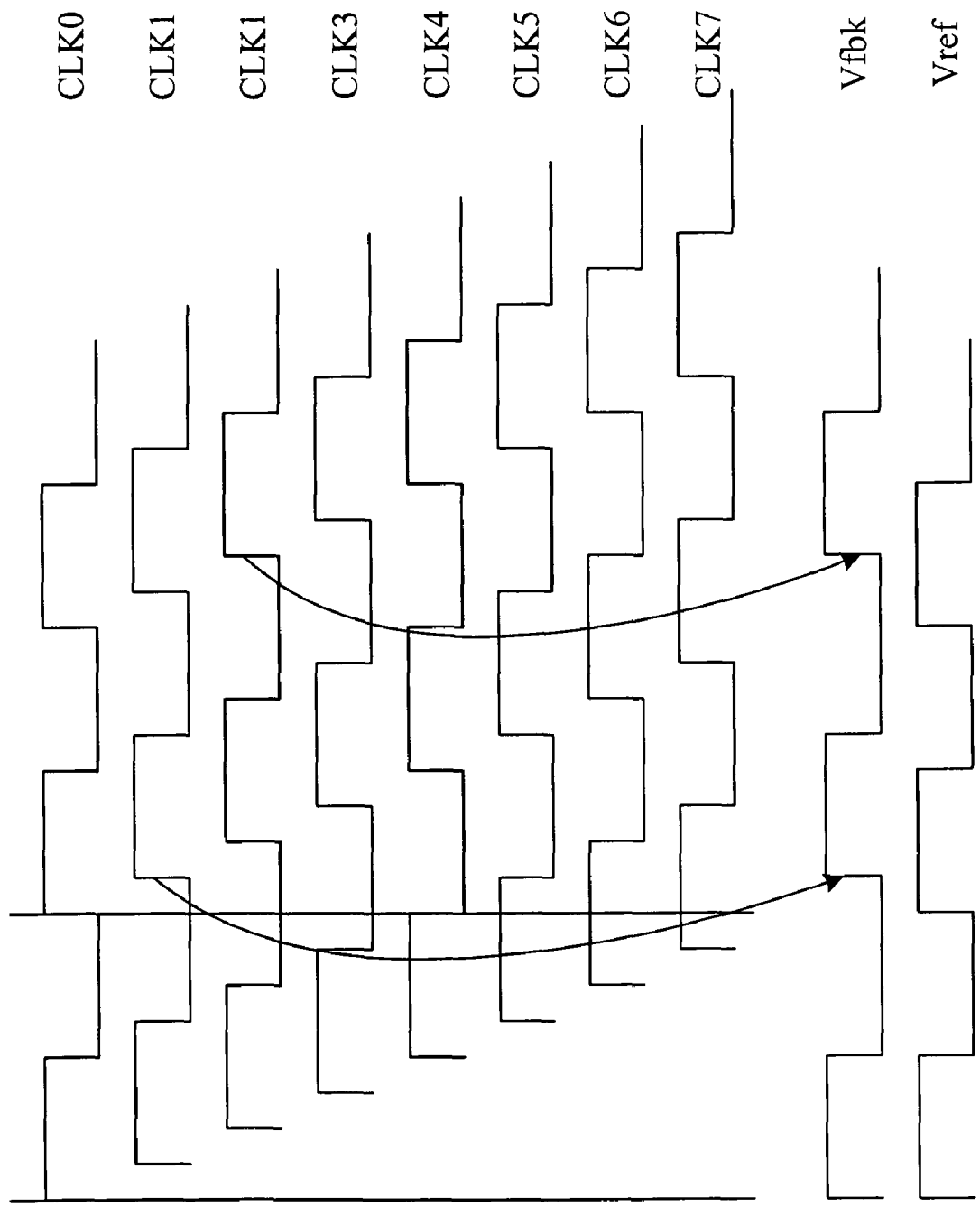
FIG. 7 is a schematic chart of an up spreading operation.

FIG. 7 is a schematic chart of an up spectrum spreading operation. When the PLL with phase rotation performs the up spectrum spreading operation, the multiplexer 252 sequentially selects clock signals CLK0, CLK1, ..., $CLK_{N-1}$ with phases $\theta_0$, $\theta_1$, $\theta_2$, ..., $\theta_{N-1}$ respectively as the target clock signal Vtar. The frequency of the target clock signal Vtar is divided by the frequency divider 260 (in this case, the divisor is one) to thereby produce the feedback clock signal Vfbk. As shown in FIG. 7, since the feedback clock signal Vfbk keeps a phase lag behind the reference clock signal Vref, the phase detector 210 continuously produces a phase error signal in order to increase the frequency of the target clock signal Vtar, thereby achieving the up spectrum spreading.

Figure 8:
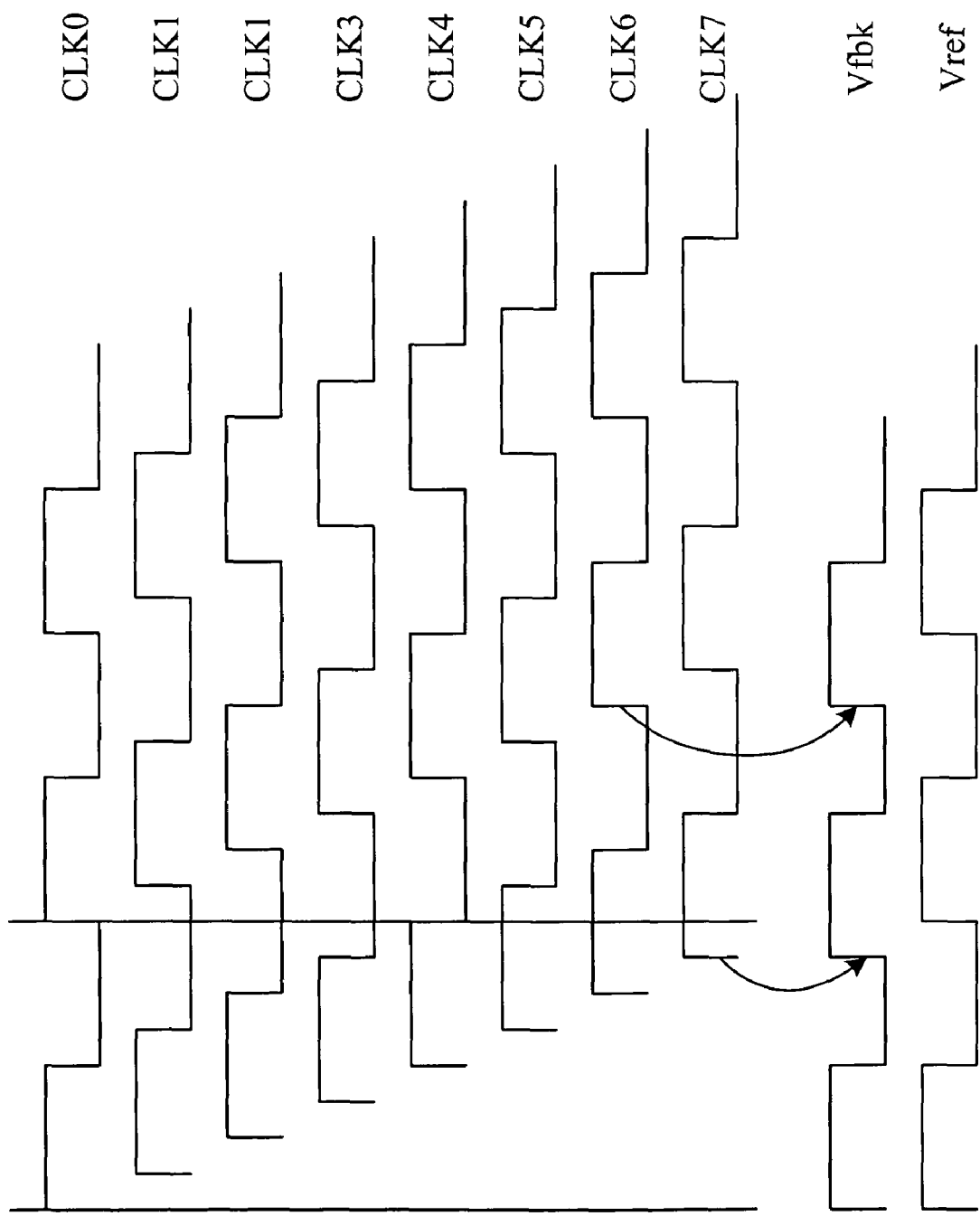
FIG. 8 is a schematic chart of a down spreading operation.

FIG. 8 is a schematic chart of a down spectrum spreading operation. When the PLL with phase rotation performs the down spectrum spreading operation, the multiplexer 252 sequentially selects clock signals CLK0, $CLK_{N-1}$, $CLK_{N-2}$, CLK 1 with phases $\theta_0$, $\theta_{N-1}$, $\theta_{N-2}$, ..., $\theta_2$, $\theta_1$ respectively as the target clock signal Vtar. The frequency of the target clock signal Vtar is divided by the frequency divider 260 (in this case, the divisor is one) to thereby produce the feedback clock signal Vfbk. As shown in FIG. 8, since the feedback clock signal Vfbk keeps a phase lead over the reference clock signal Vref, the phase detector 210 continuously produces a phase error signal in order to reduce the frequency of the target clock signal Vtar, thereby achieving the down spectrum spreading.

Similarly, when the spreading is operated by centering on the frequency of the target clock signal Vtar, the selector sequentially selects clock signals CLK0, CLK1, ..., $CLK_{N-1}$, CLK0, $CLK_{N-1}$, $CLK_{N-2}$, ..., CLK 1 with $\theta_0$, $\theta_1$, $\theta_2$, ..., $\theta_{N-1}$, $\theta_0$, $\theta_{N-1}$, $\theta_{N-2}$, ..., $\theta_2$, $\theta_1$ respectively as the target clock signal Vtar.

As cited above, U.S. Pat. No. 6,377,646 changes the divisor in the feedback divider and applies the phase swallowing to the feedback divider to thereby spread the PLL output signal. However, such a spreading way essentially changes the divisor in the feedback divider to thereby change the output frequency, and cannot be applied to a PLL in which the output frequency necessarily equals to the input frequency. In addition, such a spreading way cannot be applied when a feedback divider has a relatively small divisor, which causes the phase detector to output a significant error signal and further affects the spreading effect. By comparison, the invention only adds the phase rotation and multiplexer control logic 251 and the N-to-1 multiplexer 252, which can overcome the problems and achieve the spreading effect as same as in the prior art. Namely, since such a spreading is achieved without changing the divisor in the feedback divider, the poor spreading effect caused by a PLL in which the output frequency necessarily equals to the input frequency or a feedback divider in which the divisor is too small can be avoided.

In view of foregoing, it is known that the invention uses the phase rotation and multiplexer control logic 251 and the N to one multiplexer 252 to sequentially select N clock signals with phases $\theta_0$, $\theta_1$, $\theta_2$, ..., $\theta_{N-1}$, which are output by the VCO, in accordance with a predetermined sequence to thereby achieve the spreading. Thus, the number of used components and the cost are reduced.

Although the present invention has been explained in relation to its preferred embodiment, it is to be understood that many other possible modifications and variations can be made without departing from the spirit and scope of the invention as hereinafter claimed.

What is claimed is:

1. A phase-locked loop with phase rotation for spreading spectrum, comprising:

a phase detector, which receives a reference clock signal and a feedback clock signal to thereby produce an error signal;

a charge pump, which is connected to the phase detector in order to convert the error signal into a current signal;

a filter, which is connected to the charge pump in order to convert the current signal into a voltage signal;

a voltage-controlled oscillator (VCO), which is a ring oscillator connected to the filter in order to produce N clock signals with a same frequency based on the voltage signal, wherein the N clock signals have phases $\theta_0$ to $\theta_{N-1}$ respectively, and $\theta_j$ indicates a phase lead of $2\pi/N$ over $\theta_{j+1}$, for j=0, 1, ..., N−2; and a selector, which is connected to the VCO in order to select one from the N clock signals based on a predetermined sequence to thereby produce a target clock signal;

wherein the selector sequentially selects the clock signals with the phases $\theta_0$, $\theta_1$, $\theta_2$, ..., $\theta_{N-1}$ respectively as the target clock signal when an up spectrum spreading operation is performed, sequentially selects the clock signals with the phases $\theta_0$, $\theta_{N-1}$, $\theta_{N-2}$, ..., $\theta_2$, $\theta_1$ respectively as the target clock signal when a down spectrum spreading operation is performed, and sequentially selects the clock signals with the phases $\theta_0$, $\theta_1$, $\theta_2$, ..., $\theta_{N-1}$, $\theta_0$, $\theta_{N-1}$, ..., $\leftarrow_{N-2}$, ..., $\theta_2$, $\theta_1$ respectively as the target clock signal when a spectrum spreading is operated by centering on a frequency of the target clock signal, such that frequency of the target clock frequency is spread evenly within a fixed frequency range and energy of the target clock signal is distributed evenly in frequency domain.

2. The phase-locked loop as claimed in claim 1, further comprising:
a frequency divider, which is connected to the selector in order to perform a frequency dividing on the target clock signal to thereby produce the feedback clock signal.

3. The phase-locked loop as claimed in claim 2, wherein the error signal is a phase error signal.

4. The phase-locked loop as claimed in claim 2, wherein the filter is a low pass filter (LPF).

5. The phase-locked loop as claimed in claim 4, wherein the LPF is a passive filter.

6. The phase-locked loop as claimed in claim 5, wherein the passive filter is a three-stage LPF.

7. The phase-locked loop as claimed in claim 6, wherein the three-stage LPF is comprised of a first resistor, a first capacitor, a second capacitor, a second resistor and a third capacitor, the first resistor having a first terminal connected to the charge pump and a second terminal connected to a first terminal of the first capacitor, the first capacitor having a second terminal connected to a low potential, the second capacitor having a first terminal connected to the charge pump and a second terminal connected to the low potential, the second resistor having a first terminal connected to the charge pump and a second terminal connected to a first terminal of the third capacitor and the VCO, and the third capacitor having a second terminal connected to the low potential.

8. The phase-locked loop as claimed in claim 7, wherein the first resistor and the first capacitor provide a first pole and a zero.

9. The phase-locked loop as claimed in claim 8, wherein the second capacitor provides a second pole.

10. The phase-locked loop as claimed in claim 9, wherein the second resistor and the third capacitor provide a third pole.

11. The phase-locked loop as claimed in claim 4, wherein the LPF is an active filter.

12. The phase-locked loop as claimed in claim 11, wherein the active filter is a two-stage LPF.

13. The phase-locked loop as claimed in claim 12, wherein the two-stage LPF is comprised of a third resistor, a fourth capacitor, a fifth capacitor and an operational amplifier, the third resistor having a first terminal connected to the charge pump and a negative input terminal of the operational amplifier, the fourth capacitor having a first terminal connected to a second terminal of the third resistor and a second terminal connected to a positive output terminal of the operational amplifier, the fifth capacitor having a first terminal connected to the charge pump and the negative input terminal of the operational amplifier, the fifth capacitor having a second terminal connected to the positive output terminal, and the operational amplifier having a positive input terminal connected to a low potential.

14. The phase-locked loop as claimed in claim 2, wherein the divider performs an integral frequency dividing on the target clock signal to thereby produce the feedback clock signal.

15. The phase-locked loop as claimed in claim 2, wherein the divider performs a fractional frequency dividing on the target clock signal to thereby produce the feedback clock signal.

16. The phase-locked loop as claimed in claim 1, wherein the selector is an N-to-1 multiplexer.

* * * * *